US008330889B2

(12) United States Patent
Um et al.

(10) Patent No.: US 8,330,889 B2
(45) Date of Patent: Dec. 11, 2012

(54) THIN FILM TRANSISTOR SUBSTRATE, LIQUID CRYSTAL DISPLAY HAVING THE SAME, AND METHOD OF MANUFACTURING THE SAME

(75) Inventors: Yoon-Sung Um, Yongin-si (KR); Hoon Kim, Ansan-si (KR); Hye-Ran You, Yongin-si (KR); Jae-Jin Lyu, Yongin-si (KR); Seung-Beom Park, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/217,054

(22) Filed: Aug. 24, 2011

(65) Prior Publication Data

US 2011/0310323 A1 Dec. 22, 2011

Related U.S. Application Data

(62) Division of application No. 12/255,908, filed on Oct. 22, 2008, now Pat. No. 8,026,991.

(30) Foreign Application Priority Data

Dec. 4, 2007 (KR) .................. 10-2007-0124739

(51) Int. Cl.
*G02F 1/1368* (2006.01)
*H01L 21/336* (2006.01)
*H01L 27/15* (2006.01)
(52) U.S. Cl. ............... 349/46; 257/59; 257/72; 438/158
(58) Field of Classification Search ............. 349/46
See application file for complete search history.

(56) References Cited

U.S. PATENT DOCUMENTS

| 6,100,954 A * | 8/2000 | Kim et al. ............. 349/138 |
| 7,773,185 B2 | 8/2010 | Bae et al. |
| 2005/0036091 A1* | 2/2005 | Song ...................... 349/129 |
| 2007/0064164 A1* | 3/2007 | Tasaka et al. ............ 349/38 |
| 2008/0024689 A1 | 1/2008 | Ahn |
| 2008/0143912 A1* | 6/2008 | Kim ....................... 349/48 |
| 2008/0186304 A1* | 8/2008 | You et al. ............... 345/212 |
| 2011/0037915 A1 | 2/2011 | Tasaka et al. |

OTHER PUBLICATIONS

Notice of Allowance dated Jun. 21, 2011 in U.S. Appl. No. 12/255,908.

* cited by examiner

*Primary Examiner* — Michelle R Connelly
(74) *Attorney, Agent, or Firm* — H.C. Park & Associates, PLC

(57) ABSTRACT

In a thin film transistor, first and second thin film transistors are connected to an $N^{th}$ gate line and an $M^{th}$ data line, and first and second sub pixel electrodes are connected to the first and second thin film transistors, respectively. A third thin film transistor includes a gate electrode connected to an $(N+1)^{th}$ gate line, a semiconductor layer overlapping with the gate electrode, a source electrode connected to the second sub pixel electrode and partially overlapping with the gate electrode, and a drain electrode facing the source electrode. A first auxiliary electrode is connected to the drain electrode and arranged on the same layer as the first and second sub pixel electrodes. An opposite electrode is arranged on the same layer as the gate line and at least partially overlaps with the first auxiliary electrode with at least one insulating layer disposed therebetween.

14 Claims, 17 Drawing Sheets

THIN FILM TRANSISTOR SUBSTRATE, LIQUID CRYSTAL DISPLAY HAVING THE SAME, AND METHOD OF MANUFACTURING THE SAME

CROSS-REFERENCE TO RELATED APPLICATION

This application is a divisional of U.S. patent application Ser. No. 12/255,908, filed on Oct. 22, 2008, and claims priority from and the benefit of Korean Patent Application No. 10-2007-0124739, filed on Dec. 4, 2007, both of which are hereby incorporated by reference for all purposes as if fully set forth herein.

BACKGROUND OF THE INVENTION

1. Field of the Invention

The present invention relates generally to a thin film transistor substrate, a liquid crystal display having the same, and a method of manufacturing the same. More particularly, the present invention relates to a thin film transistor substrate and a liquid crystal display having the is same that may have improved side visibility, as well as to a method of manufacturing the same.

2. Discussion of the Background

Various electronics, such as mobile phones, TVs, and laptop computers include a display device to represent images. Recently, flat panel display devices are widely used due to their compact and slim size.

A liquid crystal display (LCD) device, which is one type of flat display that is widely used, includes two substrates that have electrodes to generate electric fields, such as pixel electrodes and a common electrode, and a liquid crystal layer disposed between the two substrates. In the field of LCD industries, wide viewing angle technologies have been developed to overcome the side visibility limitations of LCDs, such as image distortions.

A representative wide viewing angle technology uses a vertical alignment (VA) mode. In the VA mode, a wide viewing angle can be obtained by enabling liquid crystal molecules to be symmetrically driven using a fringe electric field generated by slits or protrusions, which are arranged on the common electrode and pixel electrode.

To improve side visibility, one pixel electrode may be divided into two different sub pixel electrodes, which receive voltages having different gray scales. Recent research has focused on reducing the number of steps in the manufacturing process.

SUMMARY OF THE INVENTION

The present invention provides a thin film transistor (TFT) substrate that may have improved side visibility and a simplified manufacturing process.

Additional features of the invention will be set forth in the description which follows, and in part will be apparent from the description, or may be learned by practice of the invention.

The present invention discloses a thin film transistor substrate including first, second, and third thin film transistors, first and second sub pixel electrodes, a first auxiliary electrode, and an opposite electrode. The first and second thin film transistors are connected to an $N^{th}$ gate line and an $M^{th}$ data line, and the first and second sub pixel electrodes are connected to the first and second thin film transistors, respectively. The third thin film transistor includes a gate electrode connected to an $(N+1)^{th}$ gate line, a semiconductor layer overlapping with the gate electrode, a source electrode connected to the second sub pixel electrode and partially overlapping with the gate electrode, and a drain electrode facing the source electrode. The first auxiliary electrode is connected to the drain electrode and arranged on the same layer as the first and second sub pixel electrodes. The opposite electrode is arranged on the same layer as the gate line and at least partially overlaps with the first auxiliary electrode with at least one insulating layer disposed between the opposite electrode and the first auxiliary electrode.

The present invention also discloses a thin film transistor substrate including first, second, and third thin film transistors, first and second sub pixel electrodes, and first and second auxiliary electrodes. The first and second thin film transistors are connected to an $N^{th}$ gate line and an $M^{th}$ data line, and the first and second sub pixel electrodes are connected to the first and second thin film transistors, respectively. The third thin film transistor includes a gate electrode connected to an $(N+1)^{th}$ gate line, a semiconductor layer overlapping with the gate electrode, a source electrode electrically connected to the second sub pixel electrode and partially overlapping with the gate electrode, and a drain electrode facing the source electrode. The first auxiliary electrode is connected to the drain electrode and arranged on the same layer as the first and second sub pixel electrodes, and the second auxiliary electrode is arranged on the same layer as that of the gate line and at least partially overlaps with the first sub pixel electrode with at least one insulating layer disposed between the second auxiliary electrode and the first sub pixel electrode.

The present invention also discloses a method manufacturing a thin film transistor substrate, including forming a gate pattern through a first mask process, forming a gate insulating layer on the gate pattern, forming an impurity-doped amorphous silicon layer on the gate insulating layer, forming a data pattern through a second mask process, forming at least one protective layer through a third mask process, and forming a first sub pixel electrode, a second sub pixel electrode, and a first auxiliary electrode through a fourth mask process. The gate pattern includes a gate line, a first gate electrode, a second gate electrode, a third gate electrode, a storage line, and an opposite electrode, and the data pattern includes a data line, a first source electrode, a second source electrode, a third source electrode, a first drain electrode, a second drain electrode, and a third drain electrode. The first auxiliary electrode at least partially overlaps with the opposite electrode with the gate insulating layer and the at least one protective layer therebetween.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
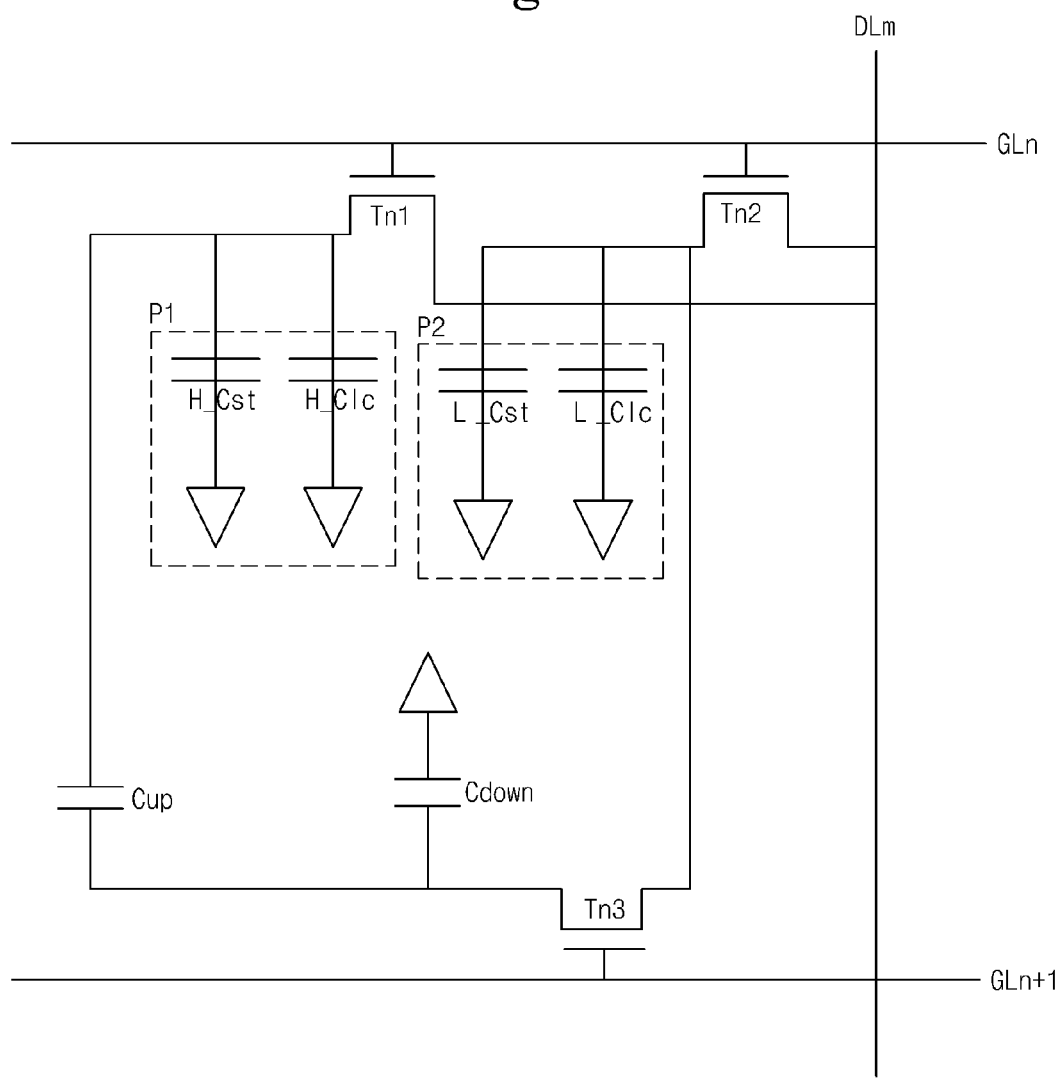
FIG. 1 is an equivalent circuit diagram showing an $n^{th}$ pixel region of a TFT substrate according to an exemplary embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "includes" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIG. 1 is an equivalent circuit diagram showing an $n^{th}$ pixel region of a liquid crystal display according to an exemplary embodiment of the present invention.

Referring to FIG. 1, the pixel region includes a first sub pixel region P1, a second sub pixel region P2, and first and second TFTs Tn1 and Tn2 connected to an $n^{th}$ gate line GLn and an $m^{th}$ data line DLm. The pixel further includes a third TFT Tn3 connected to an $(n+1)^{th}$ gate line GLn+1, and a voltage-up capacitor Cup and a voltage-down capacitor Cdown connected to the third TFT Tn3 to adjust a voltage charged to the first sub pixel region P1 and a voltage charged to the second sub pixel region P2.

The first sub pixel region P1 includes a first liquid crystal (LC) capacitor H_Clc and a first storage capacitor H_Cst connected to the first TFT Tn1. The second sub pixel region P2 includes a second liquid crystal (LC) capacitor L_Clc and a second storage capacitor L_Cst connected to the second TFT Tn2.

The first and second TFTs Tn1 and Tn2 are commonly connected to the $n^{th}$ gate line GLn and the $m^{th}$ data line DLm. Accordingly, the first and second TFTs Tn1 and Tn2 are simultaneously turned on when a gate on voltage is applied to the $n^{th}$ gate line GLn, and simultaneously supply data voltages to the first and second sub pixel regions P1 and P2 via the $m^{th}$ data line DLm. Thus, the same data voltage may be charged to the first and second sub pixel regions P1 and P2.

The third TFT Tn3 is connected to the $(n+1)^{th}$ gate line GLn+1, the second TFT Tn2, and the voltage-down capacitor Cdown. Accordingly, the third TFT Tn3 is turned on when a gate on voltage is applied to the $(n+1)^{th}$ gate line GLn+1, so that a charge share occurs in the voltage-down capacitor Cdown, which drops the level of voltage charged to the second sub pixel region P2.

As a consequence, the voltage charged to the first sub pixel region P1 has a different level than the voltage charged to the second sub pixel region P2. The voltage charged to the second sub pixel region P2 may have a lower effective value than the voltage charged to the first sub pixel region P1. The voltage charged to the first pixel region P1 may be raised to further improve the side visibility of the pixel region. The voltage-up capacitor Cup is provided to raise the voltage charged to the first sub pixel region P1.

The voltage-up capacitor Cup is connected between the voltage-down capacitor Cdown and the first TFT Tn1. The voltage-up capacitor Cup may raise the voltage charged to the first sub pixel region P1 through a charge share with the voltage-down capacitor Cdown.

Figure 2:
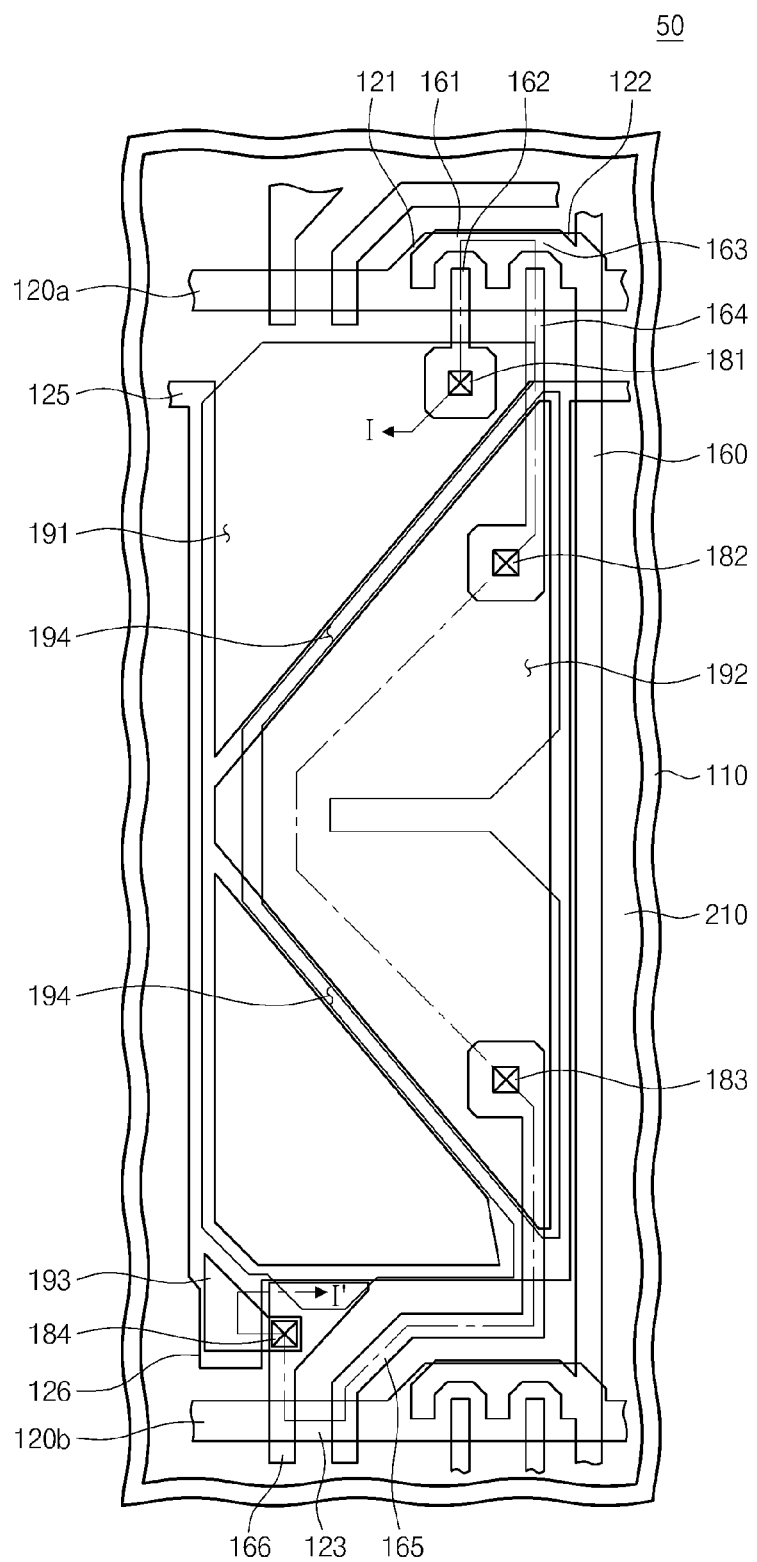
FIG. 2 is a plan view showing a pixel region of a liquid crystal display according to an exemplary embodiment of the present invention.
Figure 3:
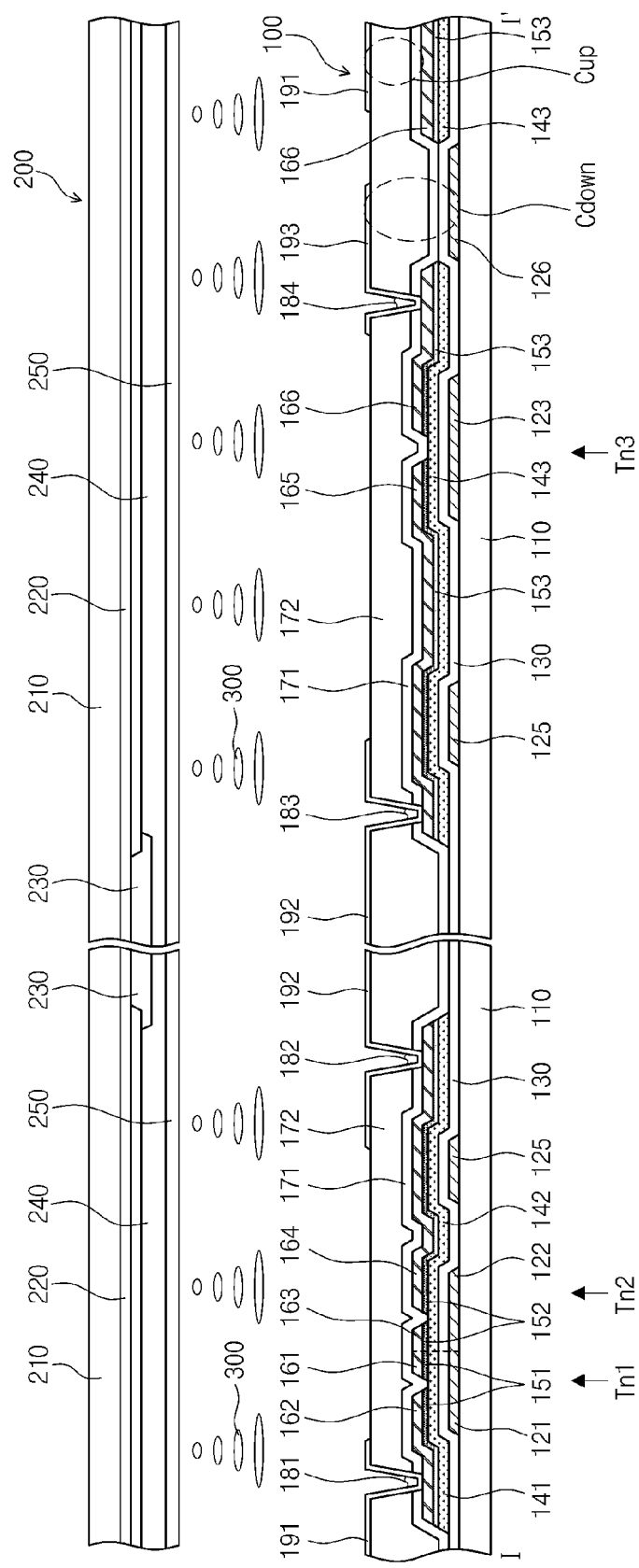
FIG. 3 is a cross sectional view of the liquid crystal display taken along line I-I' of FIG. 2.

FIG. 2 is a plan view showing a pixel region of a liquid crystal display according to an exemplary embodiment of the present invention. FIG. 3 is a cross sectional view of the liquid crystal display taken along line I-I' of FIG. 2.

Referring to FIG. 2 and FIG. 3, the liquid crystal display 50 includes a thin film transistor (TFT) substrate 100, a color filter substrate 200, and a liquid crystal layer 300.

the TFT substrate 100 includes a first insulating substrate 110, gate lines 120a and 120b, a storage line 125, an opposite electrode 126, a data line 160, first and second TFTs Tn1 and Tn2, first and second sub pixel electrodes 191 and 192, a third TFT Tn3, and an auxiliary electrode 193.

The first insulating substrate 110 may be made of an insulating material, such as glass or plastic.

The gate lines 120a and 120b are arranged parallel with each other on the first insulating substrate 110.

The storage line 125 is arranged on the same layer as the gate lines 120a and 120b and is arranged between the gate lines 120a and 120b. The storage line 125 may be provided in the pixel region in various forms. For example, the storage line 125 may include a vertical portion that is near to and parallel with the data line 160, a V-shaped bent portion, and an extension portion that is adjacent to the gate lines 120a and 120b and extends from the vertical portion.

The opposite electrode 126 is connected to the storage line 125.

The data line 160 is perpendicular to the gate lines 120a and 120b, and insulated from the gate lines 120a and 120b by a gate insulating layer 130.

The first TFT Tn1 includes a first gate electrode 121, a first semiconductor layer 141, a first ohmic contact layer 151, a first source electrode 161, and a first drain electrode 162. The second TFT Tn2 includes a second gate electrode 122, a second semiconductor layer 142, a second ohmic contact layer 152, a second source electrode 163, and a second drain electrode 164.

The first gate electrode 121 and the second gate electrode 122 may be commonly connected to the gate line 120a. The first and second semiconductor layers 141 and 142 are disposed on the gate insulating layer 130 to overlap the first and second gate electrodes 121 and 122, respectively. The first and second semiconductor layers 141 and 142 may be made of amorphous silicon (a-Si). The first and second semiconductor layers 141 and 142 may be made of polycrystalline silicon (p-Si). The first and second ohmic contact layers 151 and 152 may be disposed on the first and second semiconductor layers 141 and 142, respectively, and may include amorphous silicon.

The first and second source electrodes 161 and 163 are connected to the data line 160 on the first and second semiconductor layers 141 and 142, respectively. The second source electrode 163 may be adjacent to the first source electrode 161. The first and second source electrodes 161 and 163 may overlap the first and second gate electrodes 121 and 122, respectively.

The first drain electrode 162, which faces the first source electrode 161, is connected to the first semiconductor layer 141 via the first ohmic contact layer 151. The first drain electrode 162 is connected to the first sub pixel electrode 191 through a first contact hole 181. The second drain electrode 164, which faces the second source electrode 163, is connected to the second semiconductor layer 142 via the second ohmic contact layer 152. The second drain electrode 164 is connected to the second sub pixel electrode 192 through a second contact hole 182.

The third TFT Tn3 includes a third gate electrode 123, a third semiconductor layer 143, a third ohmic contact layer 153, a third source electrode 165, and a third drain electrode 166.

The third gate electrode 123 is connected to the gate line 120b. The third gate electrode 123 may be a part of the gate line 120b and may prevent lowering of the aperture ratio. The third semiconductor layer 143 is disposed on the gate insulating layer 130 to overlap the third gate electrode 123. The third semiconductor layer 143 may be made of amorphous silicon (a-Si) or polycrystalline silicon (p-Si).

The third source electrode 165 is arranged to overlap the third gate electrode 123 and the third semiconductor layer 143. The third source electrode 165 is connected to the third semiconductor layer 143 via the third ohmic contact layer 153, and connected to the second sub pixel electrode 192 through a third contact hole 183. The third drain electrode 166 faces the third source electrode 165 and overlaps the third semiconductor layer 143 and the third gate electrode 123. The third drain electrode 166 overlaps the first sub pixel electrode 191. The third drain electrode 166 is connected to the first auxiliary electrode 193 through a fourth contact hole 184.

Protective layers 171 and 172 are disposed on the gate insulating layer 130, the data line 160, the first, second, and third source electrodes 161, 163, and 165, and the first, second, and third drain electrodes 162, 164, and 166. The protective layer 171 may be made of an inorganic material, and the protective layer 172 may be made of an organic material or both protective layers 171 and 172 may be made of an inorganic material. The protective layer 171 may include $SiN_x$ or $SiO_x$. The protective layer 172 may include at least one of acryloyl, polyimide, and benzocyclobutene. The first protective layer 171 and the second protective layer 172 overlap each other to protect the first, second, and third TFTs Tn1, Tn2, and Tn3 and improve the turn-off properties and the aperture ratio.

The first sub pixel electrode 191 is disposed on the protective layers 171 and 172 and is connected to the first drain electrode 162 through a first contact hole 181. The first sub pixel electrode 191 at least partially overlaps the storage line 125 to form the first storage capacitor H_Cst. The first sub pixel electrode 191 may be made of a transparent conductive material, such as indium tin oxide (ITO), indium zinc oxide (IZO), or indium tin zinc oxide (ITZO). The first sub pixel electrode 191 may be V-shaped in the pixel region.

The first sub pixel electrode 191 at least partially overlaps the third drain electrode 166, with the first and second protective layers 171 and 172 therebetween, thereby forming the voltage-up capacitor Cup. The first sub pixel electrode 191 may be connected to the first drain electrode 162 and may at least partially overlap a drain electrode pattern that is arranged on the same layer as the first drain electrode 162 to form the voltage-up capacitor Cup.

The second sub pixel electrode 192 is disposed on the first and second protective layers 171 and 172, and is connected to the second drain electrode 164 through the second contact hole 182 and to the third source electrode 165 through the third contact hole 183. The second sub pixel electrode 192 at least partially overlaps the storage line 125 to form the second storage capacitor L_Cst. Like the first sub pixel electrode 191, the second sub pixel electrode 192 may be made of a transparent material, such as ITO, IZO, or ITZO. The second sub pixel electrode 192 may be V-shaped in the pixel region.

The first and second sub pixel electrodes 191 and 192 are separated by a separation portion 194. The separation portion 194 may overlap the storage line 125 to prevent the occurrence of light leakage in the separation portion 194. The first and second sub pixel electrodes 191 and 192 may have various shapes, such as "+" and "X", as well as a V-shaped form.

The first auxiliary electrode 193 is disposed on the protective layers 171 and 172 and is connected to the third drain electrode 166 through the fourth contact hole 184. The first auxiliary electrode 193 may at least partially overlap the opposite electrode 126, thereby forming the voltage-down capacitor Cdown.

The first, second, and third semiconductor layers 141, 142, and 143, and the first, second, and third ohmic contact layers 151, 152, and 153 are formed using the same mask as the data line 160, the first, second, and third source electrodes 161, 163, and 165, and the first, second, and third drain electrodes 162, 164, and 166. And the first, second, and third semiconductor layers 141, 142, and 143, and the first, second, and third ohmic contact layers 151, 152, and 153 are arranged under the data line 160, the first, second, and third source electrodes 161, 163, and 165, and the first, second, and third drain electrodes 162, 164, and 166, except in channel regions.

The color filter substrate 200 includes a second insulating substrate 210, a black matrix 220, a color filter 230, a planarization layer 240, and a common electrode 250.

The second insulating substrate 210 may be made of an insulating material, such as glass or plastic. The black matrix 220 may be a thin film of a metal such as chromium (Cr) or chromium oxide ($CrO_x$) and is disposed on the portion of the second insulating substrate 210 corresponding to the inactive portion of the liquid crystal display. The color filter 230 is disposed on the second insulating substrate 210 corresponding to the active portion of the liquid crystal display, which is opposite to the first and second sub pixel electrodes 191 and 192 on the TFT substrate 100. The planarization layer 240 is formed on the black matrix 220 and the color filter 230 and may be made of acrylic material. The common electrode 250 is disposed on the planarization layer 240 and may be made of ITO or IZO.

The liquid crystal layer 300 is disposed between the TFT substrate 100 and the color filter substrate 200. The liquid crystal layer 300 includes liquid crystal molecules to control the transmission of light passing therethrough in response to electric field formed between the TFT substrate 100 and the color filter substrate 200.

Figure 4:
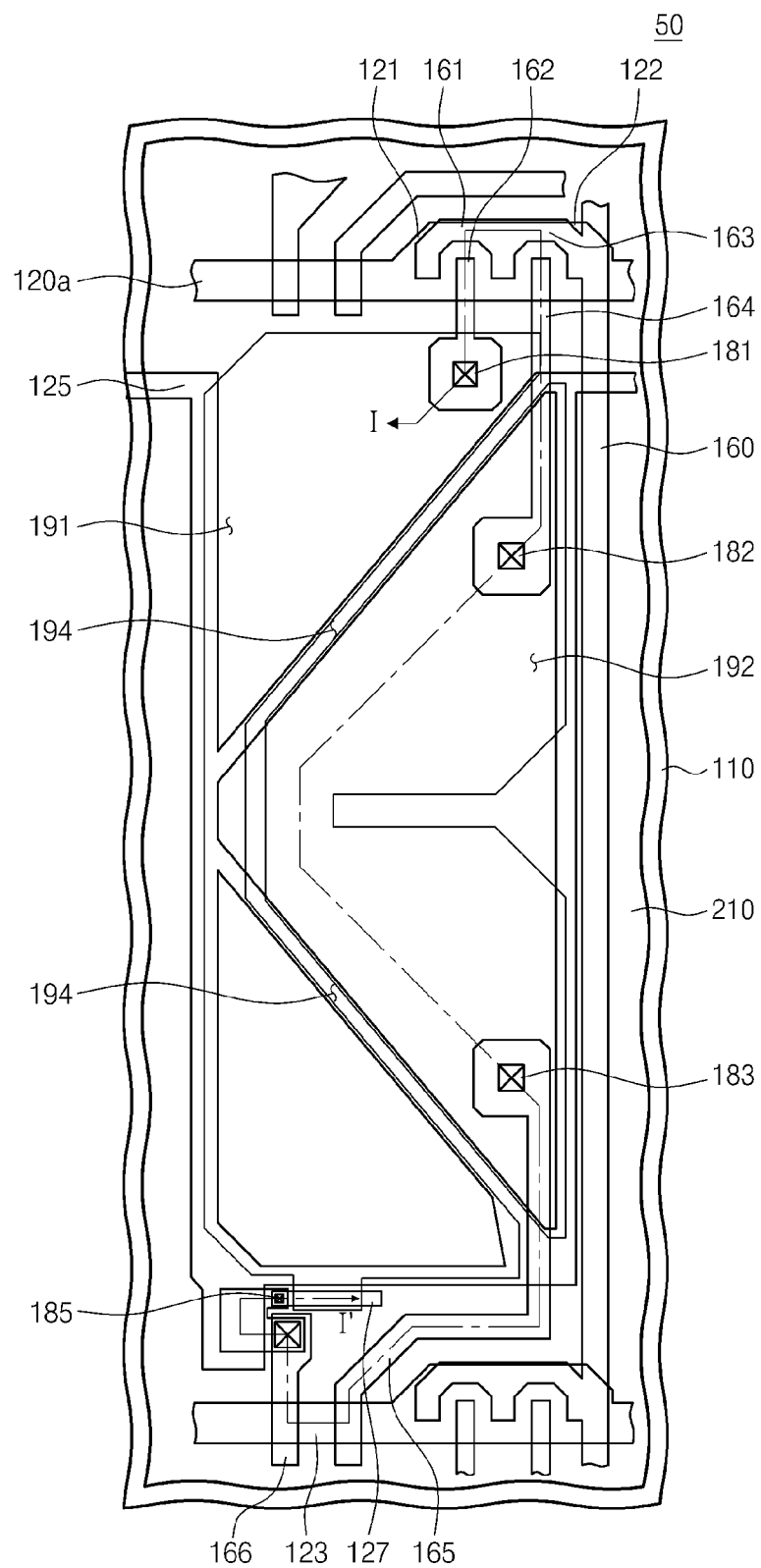
FIG. 4 is a plan view showing a pixel region of a liquid crystal display according to another exemplary embodiment of the present invention.
Figure 5:
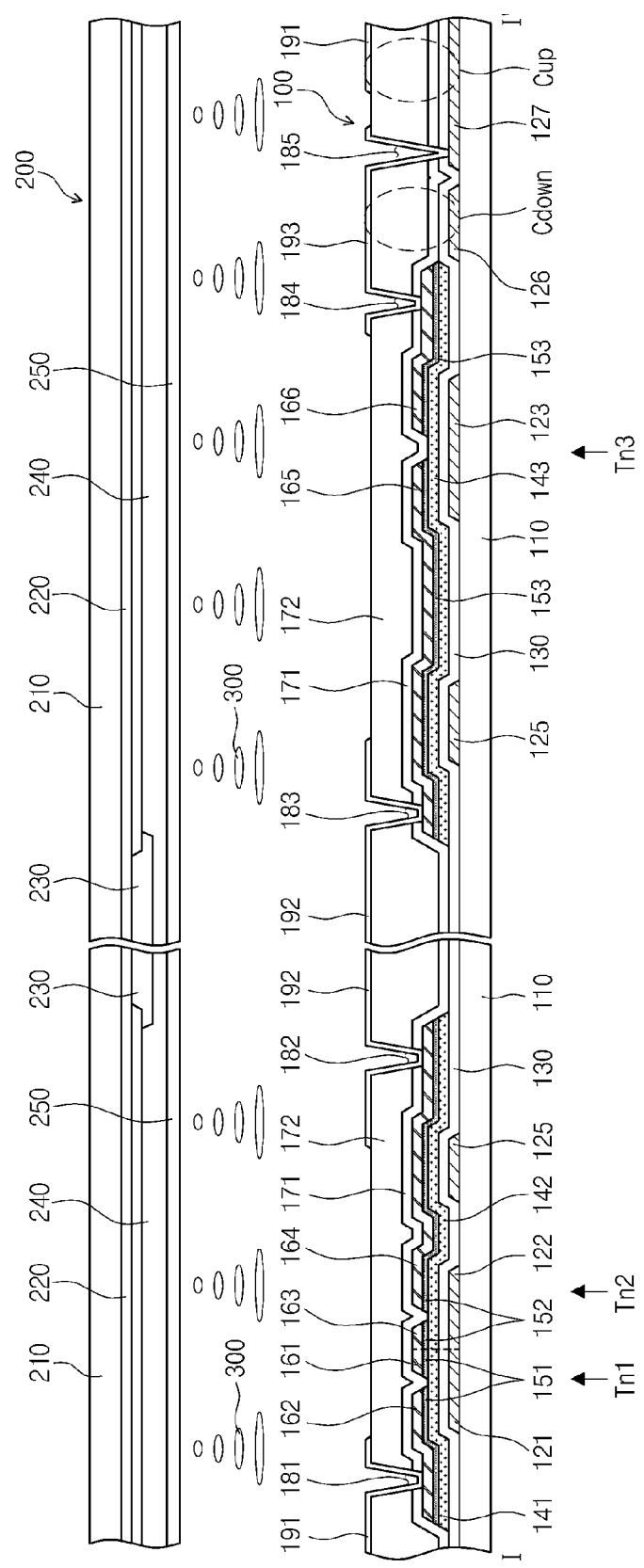
FIG. 5 is a cross sectional view of the liquid crystal display taken along line I-I' of FIG. 4.

FIG. 4 is a plan view showing a pixel region of a liquid crystal display according to another exemplary embodiment of the present invention, and FIG. 5 is a cross sectional view of the liquid crystal display taken along line I-I' of FIG. 4.

Referring to FIG. 4 and FIG. 5, the liquid crystal display 50 includes a TFT substrate 100, a color filter substrate 200, and a liquid crystal layer 300.

The TFT substrate 100 includes a first insulating substrate 110, gate lines 120*a* and 120*b*, a storage line 125, an opposite electrode 126, a data line 160, first and second TFTs Tn1 and Tn2, first and second sub pixel electrodes 191 and 192, a third TFT Tn3, and first and second auxiliary electrodes 193 and 127.

The opposite electrode 126 is connected to the storage line 125.

The first sub pixel electrode 191 is disposed on the protective layers 171 and 172 and is connected to the first drain electrode 162 through a first contact hole 181.

The first auxiliary electrode 193 is connected to the third drain electrode 166 through the fourth contact hole 184 and to the second auxiliary electrode 127 through a fifth contact hole 185. The first auxiliary electrode 193 overlaps the opposite electrode 126 at least partially, with at least one insulating layer, for example, the protective layers 171 and 172, disposed therebetween, thereby forming the voltage-down capacitor Cdown.

The second auxiliary electrode 127 is disposed on the same layer as the storage line 125 and is connected to the first auxiliary electrode 193. The second auxiliary electrode 127 overlaps the first sub pixel electrode 191, with the gate insulating layer 130 and the first and second protective layers 171 and 172 disposed therebetween, thereby forming the voltage-up capacitor Cup. Accordingly, the second auxiliary electrode 127 may cause a charge share between the voltage charged to the voltage-down capacitor Cdown and the voltage charged to the voltage-up capacitor Cup.

The first, second, and third semiconductor layers 141, 142, and 143, and the first, second, and third ohmic contact layers 151, 152, and 153 are formed using the same mask as the data line 160, the first, second, and third source electrodes 161, 163, and 165, and the first, second, and third drain electrodes 162, 164, and 166. And the first, second, and third semiconductor layers 141, 142, and 143, and the first, second, and third ohmic contact layers 151, 152, and 153 are arranged under the data line 160, the first, second, and third source electrodes 161, 163, and 165, and the first, second, and third drain electrodes 162, 164, and 166, except for in channel regions.

The descriptions of the same components as those of FIG. 2 and FIG. 3 will not be repeated.

FIG. 6, FIG. 7, FIG. 8A, FIG. 8B, FIG. 9A, and FIG. 9B are cross sectional views showing a manufacturing process of the TFT substrate shown in FIG. 3.

Figure 6:
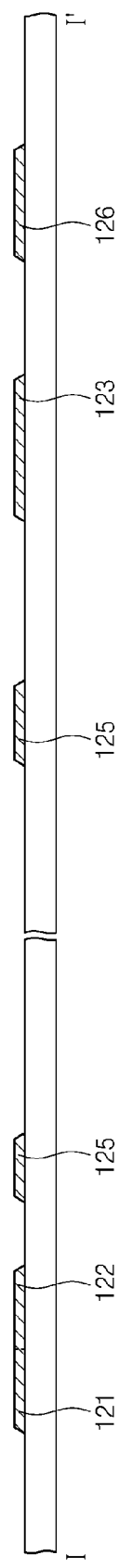
FIG. 6, FIG. 7, FIG. 8A, FIG. 8B, FIG. 9A, and FIG. 9B are cross sectional views showing a manufacturing process of the TFT substrate shown in FIG. 3.

FIG. 6 shows forming a gate pattern through a first mask process.

Referring to FIG. 6, a gate pattern is formed using the first mask process. The gate pattern includes a gate line, first, second, and third gate electrodes 121, 122, and 123, a storage line 125, and an opposite electrode 126.

More specifically, a gate metallic layer is first formed on a first insulating substrate 110 using a deposition method, such as sputtering. The gate metallic layer may be made of Mo, Al, Cr, Cu, or an alloy thereof. The gate metallic layer may be a single layer or multiple layers.

Next, the gate pattern is formed through photolithography and etching using a first mask.

Figure 7:
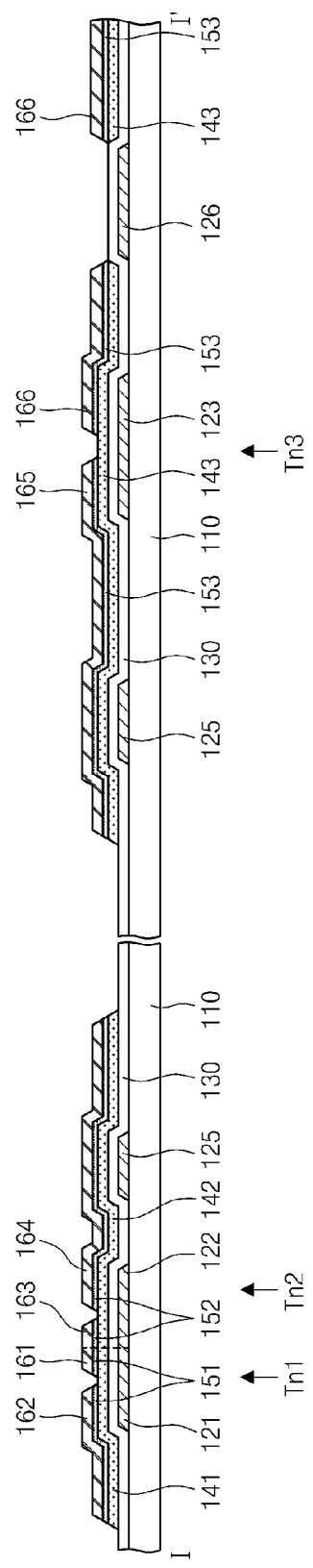

FIG. 7 shows forming a data pattern through a second mask process.

Referring to FIG. 7, a gate insulating layer 130, and an impurity-doped amorphous silicon layer are sequentially deposited on the insulating substrate 110 on which the gate pattern has been formed, using a deposition method, such as plasma enhanced chemical vapor deposition (PECVD) or chemical vapor deposition (CVD). A data metallic layer is formed on the impurity-doped amorphous silicon layer using a deposition method, such as sputtering.

The gate insulating layer 130 may be made of silicon nitride $SiN_X$ or silicon oxide $SiO_x$. The data metallic layer may be made of Mo, Al, Cr, Cu, or an alloy thereof. The data metallic layer may be a single layer or multiple layers.

Next, photoresist is applied and then a photoresist pattern having steps is formed through photolithography using a second mask. The photoresist partially remains on regions where channels for the first, second, and third TFTs Tn1, Tn2, and Tn3 are formed, wholly on a region where the data pattern is formed, and is removed from the remaining parts.

Subsequently, the data metallic layer of the pixel region is etched using a first etching process, and the impurity-doped amorphous silicon layer is etched using a second etching process. Then, a uniform depth of the photoresist is eliminated using an ashing process. The impurity-doped amorphous silicon of the channel region is removed through a third etching process, and then the remaining photoresist is eliminated to form the data pattern, which includes the data line, the first, second, and third source electrodes 161, 163, and 165, and the first, second, and third drain electrodes 162, 164, and 166. The first, second, and third semiconductor layers 141, 142, and 143 and the first, second, and third ohmic contact layers 151, 152, and 153 are formed under the data pattern.

Figure 8A:
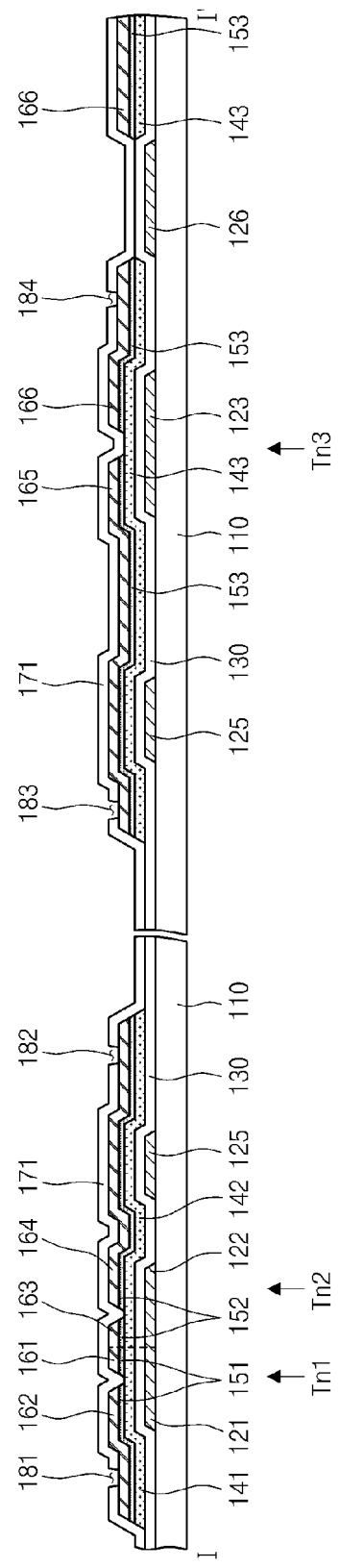
Figure 8B:
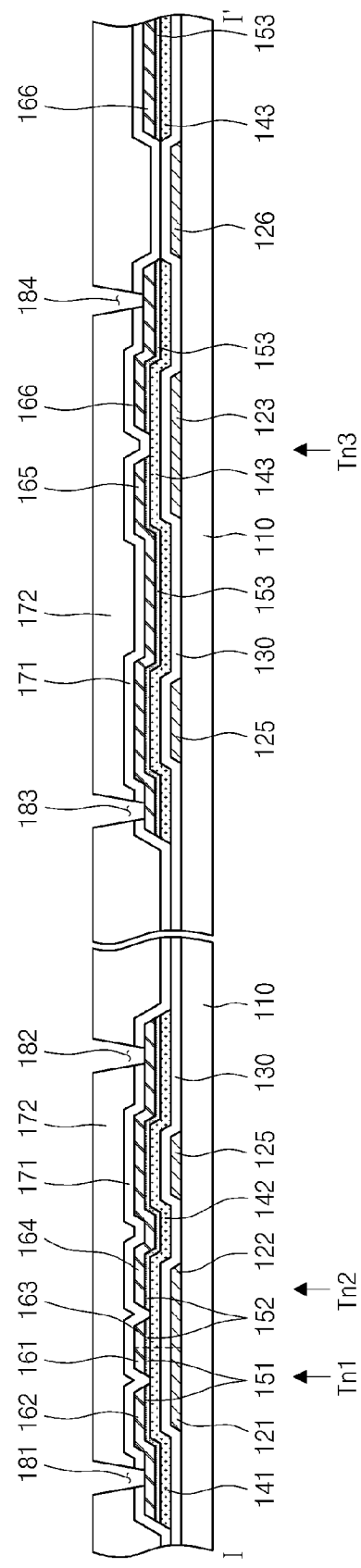

FIG. 8A and FIG. 8B show alternatives for forming protective layers through a third mask process.

Referring to FIG. 8A and FIG. 8B, the protective layers 171 and 172, which include first, second, third, and fourth contact holes 181, 182, 183, and 184 are formed through a third mask process.

An inorganic material may be deposited on the insulating substrate 110, on which the data pattern has been formed, through a deposition method, such as PECVD and CVD, as shown in FIG. 8A. Next, the inorganic protective layer 171 is formed through photolithography and etching using the third mask, which includes the first, second, third, and fourth contact holes 181, 182, 183, and 184.

Additionally, an organic material may be further deposited after the deposition of the inorganic material, as shown in FIG. 8B. In this case, the inorganic protective layer 171 and organic protective layer 172 are formed through photolithography and etching using the third mask, which includes the first, second, third, and fourth contact holes 181, 182, 183, and 184.

Figure 9A:
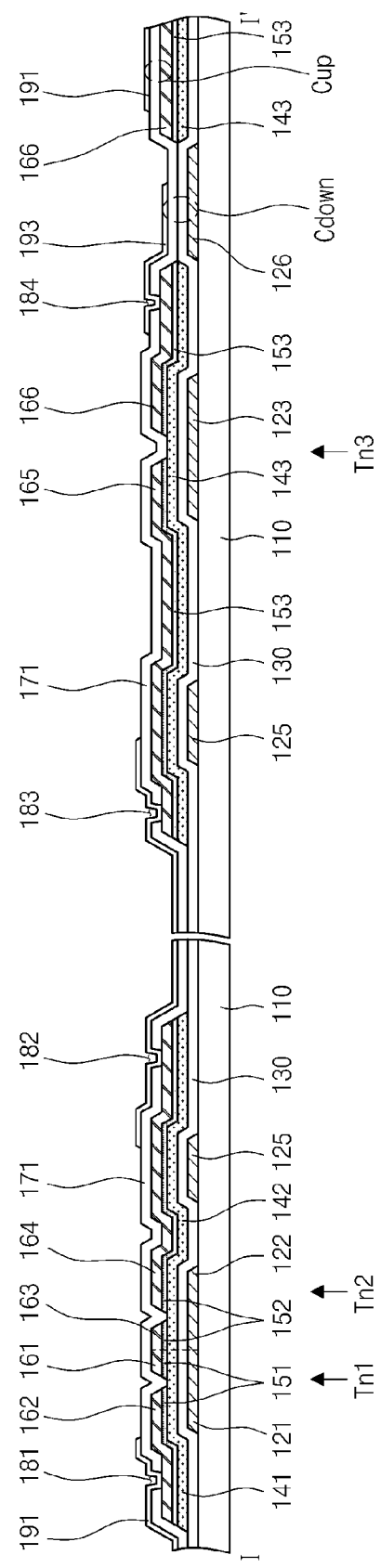
Figure 9B:
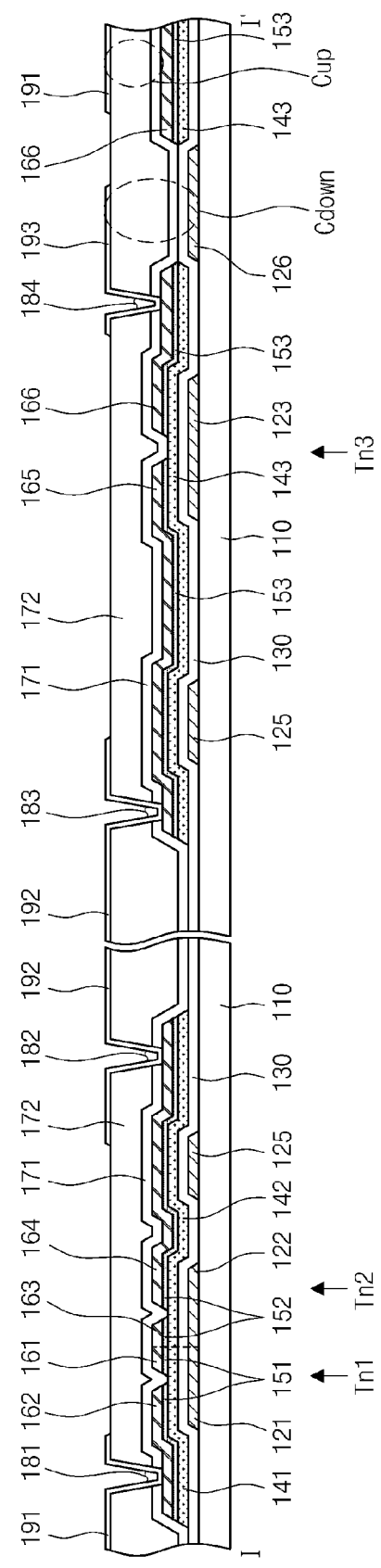

FIG. 9A and FIG. 9B show forming the first and second sub pixel electrodes and auxiliary electrodes through a fourth mask process.

Referring to FIG. 9A and FIG. 9B, the pixel electrode pattern, which includes the first sub pixel electrode 191, the second sub pixel electrode 192, and the first auxiliary electrode 193, is formed through a fourth mask process.

More specifically, firstly, a transparent conductive material, such as ITO, IZO, or ITZO is deposited on an inorganic protective layer 171 or organic protective layer 172 using a deposition method, such as sputtering. Then, the first and second sub pixel electrodes 191 and 192, and the first auxiliary electrode 193 are patterned through photolithography and etching using a fourth mask. The first and second sub pixel electrodes 191 and 192 are separated from each other by the separation portion 194.

More specifically, the first sub pixel electrode 191 overlaps the third drain electrode 166 with the inorganic protective layer 171 therebetween, as shown in FIG. 9A. Accordingly, the first sub pixel electrode 191 and the third drain electrode 166 form the voltage-up capacitor Cup. Alternatively, the first sub pixel electrode 191 may at least partially overlap the third drain electrode 166, with the inorganic protective layer 171 and the organic protective layer 172 therebetween, thereby forming the voltage-up capacitor Cup, as shown in FIG. 9B.

The second sub pixel electrode 192 is connected to the second drain electrode 164 and the third source electrode 165 via the second contact hole 182 and the third contact hole 183, respectively.

The first auxiliary electrode 193 is connected to the third drain electrode 166 through the fourth contact hole 184. More specifically, the first auxiliary electrode 193 at least partially overlaps the opposite electrode 126, with the gate insulating layer 130 and inorganic protective layer 171 therebetween, as shown in FIG. 9A. Accordingly, the first auxiliary electrode 193 and the opposite electrode 126 form the voltage-down capacitor Cdown. Alternatively, the first auxiliary electrode 193 may at least partially overlap the opposite electrode 126, with the gate insulating layer 130, the inorganic protective layer 171, and the organic protective layer 172 therebetween, thereby forming the voltage-down capacitor Cup, as shown in FIG. 9B.

FIG. 10, FIG. 11, FIG. 12A, FIG. 12B, FIG. 13A, and FIG. 13B are cross sectional views showing a manufacturing process of the TFT substrate shown in FIG. 5.

Figure 10:
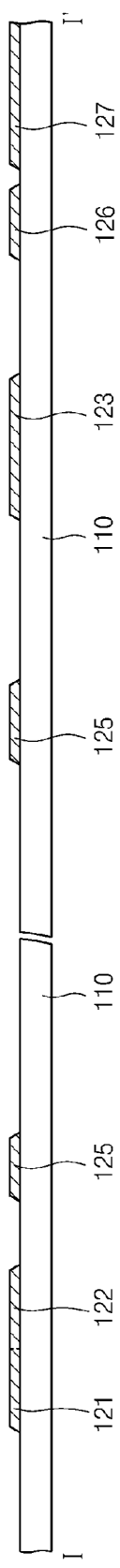
FIG. 10, FIG. 11, FIG. 12A, FIG. 12B, FIG. 13A, and FIG. 13B are cross sectional views showing a manufacturing process of the TFT substrate shown in FIG. 5.

FIG. 10 shows forming a first pattern group through a first mask process.

Referring to FIG. 10, a gate pattern is formed using the first mask process. The gate pattern includes a gate line, first, second, and third gate electrodes 121, 122, and 123, a storage line 125, an opposite electrode 126, and a second auxiliary electrode 127.

More specifically, a gate metallic layer is first formed on an insulating substrate 110 through sputtering. Next, a gate metallic layer is patterned through photolithography and etching using a first mask to form the gate pattern.

Figure 11:
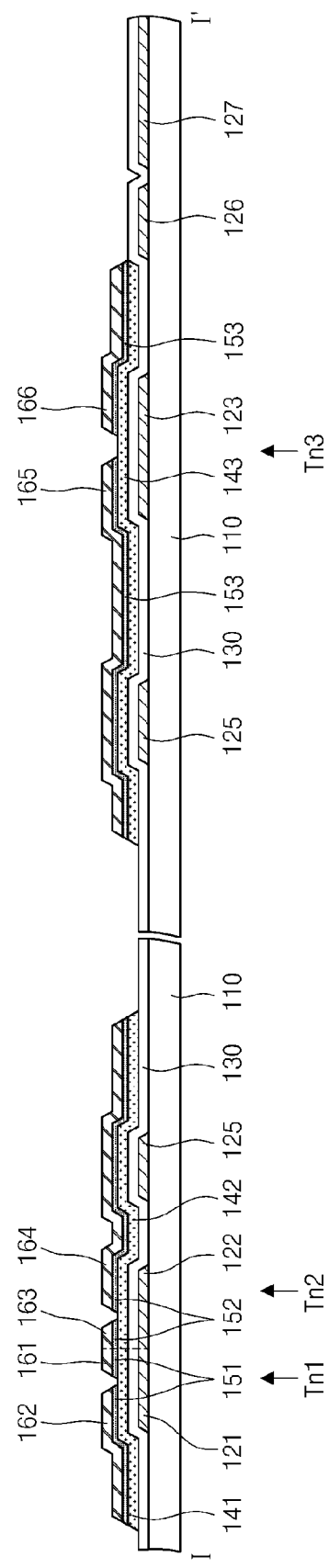

FIG. 11 shows forming a data pattern through a second mask process.

Referring to FIG. 11, a gate insulating layer 130 and an impurity-doped amorphous silicon layer are sequentially deposited on the insulating substrate 110, on which the gate pattern has been formed. Next, a data metallic layer is deposited on the impurity-doped amorphous silicon layer. Next, photoresist is applied and then a photoresist pattern having steps is formed through photolithography using a second mask. Subsequently, the data metallic layer, the impurity-doped amorphous silicon layer, and amorphous silicon layer are etched to form the data pattern, which includes the data line, the first, second, and third source electrodes 161, 163, and 165, and the first, second, and third drain electrodes 162, 164, and 166. The third drain electrode 166 does not overlap the first sub pixel electrode 191.

Figure 12A:
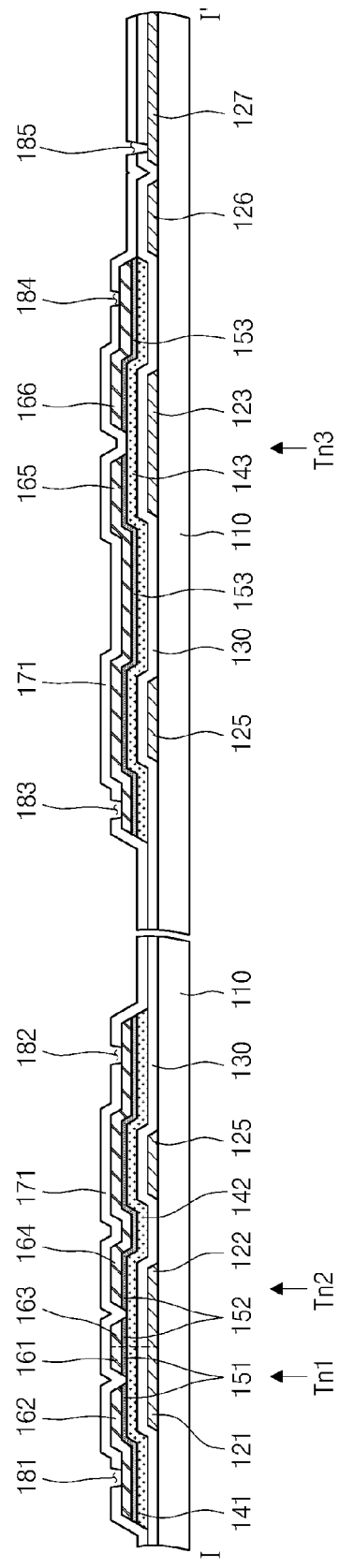
Figure 12B:
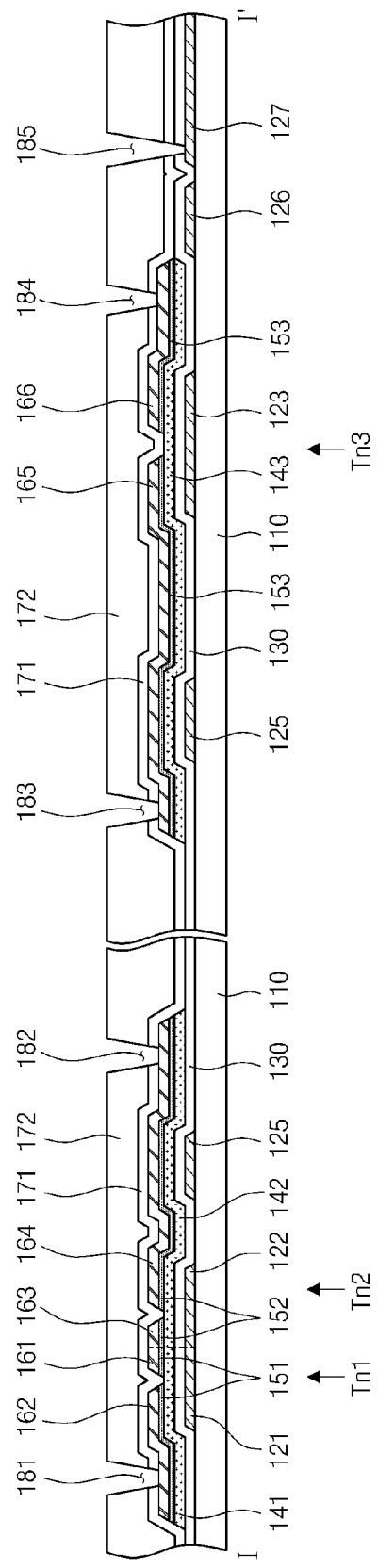

FIG. 12A and FIG. 12B show alternatives for forming protective layers through a third mask process.

Referring to FIG. 12A and FIG. 12B, the protective layers 171 and 172, which include first, second, third, fourth, and fifth contact holes 181, 182, 183, 184, and 185 are formed through the third mask process.

Additionally, an inorganic material may be deposited on the insulating substrate 110 on which the data pattern has been formed, using a deposition method such as PECVD and CVD, as shown in FIG. 8A. In this case, the inorganic protective layer 171 is formed through photolithography and etching using the third mask, which includes the first, second, third, fourth, and fifth contact holes 181, 182, 183, 184, and 185.

An organic material may be further deposited after the deposition of the inorganic material, as shown in FIG. 12B. Next, the inorganic protective layer 171 and organic protective layer 172 are formed through photolithography and etching using the third mask, which includes the first, second, third, fourth, and fifth contact holes 181, 182, 183, 184, and 185.

Figure 13A:
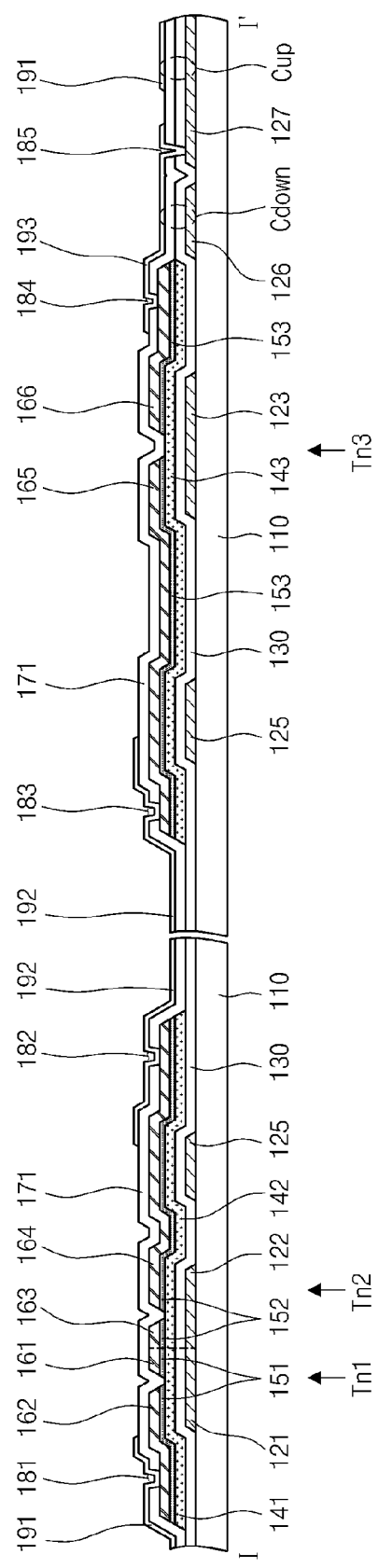
Figure 13B:
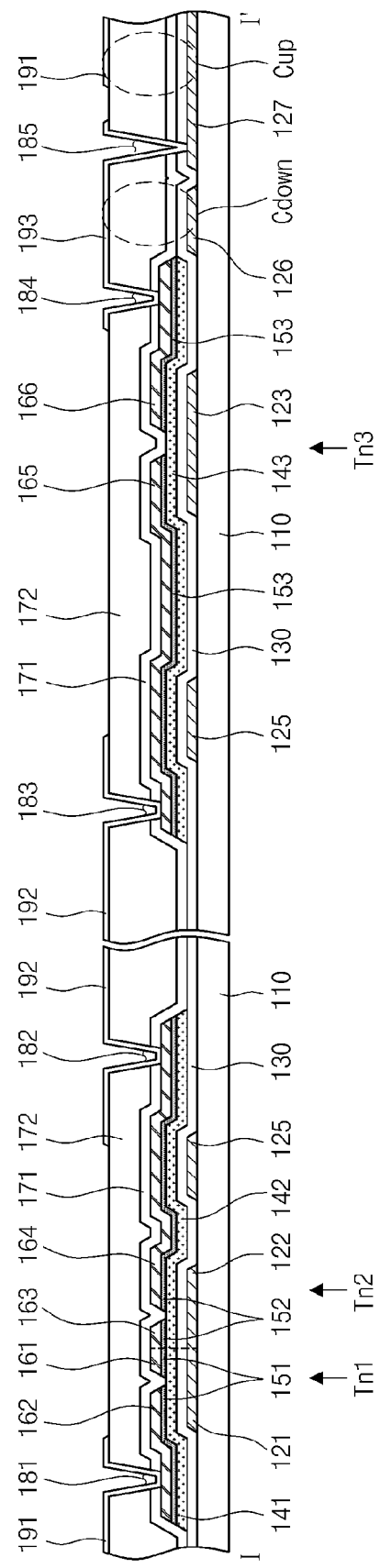

FIG. 13A and FIG. 13B show forming the first and second sub pixel electrodes, and auxiliary electrodes through a fourth mask process.

Referring to FIG. 13A and FIG. 13B, the pixel electrode pattern is formed through a fourth mask process, which includes the first sub pixel electrode 191, the second sub pixel electrode 192, and the first auxiliary electrode 193.

More specifically, firstly, a transparent conductive material, such as ITO, IZO, or ITZO, is deposited on an inorganic protective layer 171 or organic protective layer 172 through a deposition method, such as sputtering. Then, the first and second sub pixel electrodes 191 and 192 and the first auxiliary electrode 193 are patterned through photolithography and etching using a fourth mask. The first and second sub pixel electrodes 191 and 192 are separated from each other by the separation portion 194.

More specifically, the first sub pixel electrode 191 overlaps the second auxiliary electrode 127 with the inorganic protective layer 171 therebetween, as shown in FIG. 13A. Accordingly, the first sub pixel electrode 191 and the second auxiliary electrode 127 form the voltage-up capacitor Cup. Alternatively, the first sub pixel electrode 191 may at least partially overlap the second auxiliary electrode 127, with the inorganic protective layer 171 and the organic protective layer 172 therebetween, thereby to form the voltage-up capacitor Cup, as shown in FIG. 13B.

The second sub pixel electrode 192 is connected to the second drain electrode 164 and the third source electrode 165 via the second contact hole 182 and the third contact hole 183, respectively.

The first auxiliary electrode 193 is connected to the third drain electrode 166 and the second auxiliary electrode 127 via the fourth contact hole 184 and the fifth contact hole 185, respectively, as shown in FIG. 13A. More specifically, the first auxiliary electrode 193 overlaps the opposite electrode 126, with the gate insulating layer 130 and inorganic protective layer 171 therebetween, as shown in FIG. 13A. Accordingly, the first auxiliary electrode 193 and the opposite electrode 126 form the voltage-down capacitor Cdown. Alternatively, the first auxiliary electrode 193 may overlap the opposite electrode 126, with the gate insulating layer 130, the inorganic protective layer 171, and the organic protective layer 172 therebetween, thereby forming the voltage-down capacitor Cup, as shown in FIG. 13B.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor substrate comprising:
a first thin film transistor and a second thin film transistor connected to an $N^{th}$ gate line and an $M^{th}$ data line;
a first sub pixel electrode and a second sub pixel electrode connected to the first thin film transistor and the second thin film transistor, respectively;
a third thin film transistor comprising a gate electrode connected to an $(N+1)^{th}$ gate line, a semiconductor layer overlapping with the gate electrode, a source electrode connected to the second sub pixel electrode and partially overlapping with gate electrode, and a drain electrode facing the source electrode;
a first capacitor comprising:
a first auxiliary electrode connected to the drain electrode and arranged on the same layer as the first sub pixel electrode and second sub pixel electrode; and
an opposite electrode arranged on the same layer as the gate line and at least partially overlapping with the first auxiliary electrode with at least one insulating layer disposed between the opposite electrode and the first auxiliary electrode; and
a second capacitor formed between the drain electrode of the third thin film transistor and the first sub pixel electrode.

2. The thin film transistor substrate of claim 1, wherein the opposite electrode is connected to a storage line.

3. The thin film transistor substrate of claim 1, wherein the second capacitor comprises the drain electrode extending to overlap with the first sub pixel electrode with at least one insulating layer disposed between the drain electrode and the first sub pixel electrode.

4. The thin film transistor substrate of claim 1, wherein the second capacitor comprises a second auxiliary electrode connected to the drain electrode and at least partially overlapping with the first sub pixel electrode with at least one insulating layer disposed between the second auxiliary electrode and the first sub pixel electrode, and
wherein the second auxiliary electrode is arranged on substantially the same layer as the gate line.

5. The thin film transistor substrate of claim 1, wherein the at least one insulating layer has a double layer structure, the double layer structure comprising an inorganic layer and an organic layer.

6. The thin film transistor substrate of claim 1, wherein the first thin film transistor, the second thin film transistor, and the third thin film transistor are formed such that the semiconductor layer overlaps the source electrode and the drain electrode except for in channel regions.

7. The thin film transistor substrate of claim 1, wherein at least one corner portion of the first sub pixel electrode has an oblique side.

8. The thin film transistor substrate of claim 7, wherein the first auxiliary electrode has substantially polygonal shape, and at least one side of the first auxiliary electrode is parallel to the oblique side.

9. A liquid crystal display, comprising:
a first substrate;
a second substrate comprising a color filter and being arranged opposite to the first substrate; and
a liquid crystal layer disposed between the first substrate and the second substrate, wherein the first substrate comprises:
a first thin film transistor and a second thin film transistor connected to an $N^{th}$ gate line and an $M^{th}$ data line;
a first sub pixel electrode and a second sub pixel electrode connected to the first thin film transistor and the second thin film transistor, respectively;
a third thin film transistor comprising a gate electrode connected to an $(N+1)^{th}$ gate line, a semiconductor layer overlapping with the gate electrode, a source electrode connected to the second sub pixel electrode and partially overlapping with the gate electrode, and a drain electrode facing the source electrode;
a first capacitor comprising:
a first auxiliary electrode connected to the drain electrode and arranged on the same layer as the first sub pixel electrode and second sub pixel electrode; and
an opposite electrode arranged on the same layer as the gate line and at least partially overlapping with the first auxiliary electrode with at least one insulating layer disposed between the opposite electrode and the first auxiliary electrode
a second capacitor formed between the drain electrode of the third thin film transistor and the first sub pixel electrode.

10. The liquid crystal display of claim 9, wherein the opposite electrode is connected to a storage line.

11. The liquid crystal display of claim 9, wherein the second capacitor comprises the drain electrode extending to overlap with the first sub pixel electrode with at least one insulating layer disposed between the drain electrode and the first sub pixel electrode.

12. The liquid crystal display of claim 9, wherein the second capacitor comprises a second auxiliary electrode connected to the drain electrode and at least partially overlapping with the first sub pixel electrode with at least one insulating layer disposed between the second auxiliary electrode and the first sub pixel electrode, and wherein the second auxiliary electrode is arranged on the same layer as the gate line.

13. The liquid crystal display of claim 10, wherein at least one corner portion of the first sub pixel electrode has an oblique side.

14. The liquid crystal display of claim 13, wherein the first auxiliary electrode has substantially polygonal shape, and at least one side of the first auxiliary electrode is parallel to the oblique side.

\* \* \* \* \*